(12) United States Patent
Sander

(10) Patent No.: US 7,946,861 B2
(45) Date of Patent: May 24, 2011

(54) CONNECTION DEVICE

(75) Inventor: Reinhard Sander, Weissenohe (DE)

(73) Assignee: FCI, Versailles (FR)

( * ) Notice: Subject to any disclaimer, the term of this patent is extended or adjusted under 35 U.S.C. 154(b) by 0 days.

(21) Appl. No.: 12/449,283

(22) PCT Filed: Feb. 2, 2007

(86) PCT No.: PCT/IB2007/051450
§ 371 (c)(1),
(2), (4) Date: Sep. 28, 2009

(87) PCT Pub. No.: WO2008/093175
PCT Pub. Date: Aug. 7, 2008

(65) Prior Publication Data
US 2010/0093197 A1    Apr. 15, 2010

(51) Int. Cl.
H01R 12/00    (2006.01)
(52) U.S. Cl. .......................................................... 439/82
(58) Field of Classification Search .................... 439/82, 439/49, 67, 74, 75, 748, 326; 174/267
See application file for complete search history.

(56) References Cited

U.S. PATENT DOCUMENTS

| | | | | |
|---|---|---|---|---|
| 2,877,441 A * | 3/1959 | Narozny | ........................ | 439/857 |
| 2,938,068 A * | 5/1960 | Silverschotz | .............. | 174/84 R |
| 2,950,458 A * | 8/1960 | Artz | ............................... | 439/872 |
| 2,972,727 A * | 2/1961 | Flanagan, Jr. et al. | ........... | 439/82 |
| 4,181,387 A * | 1/1980 | Walters | ........................... | 439/82 |
| 4,698,026 A * | 10/1987 | Rolf | ................................. | 439/82 |
| 4,950,173 A * | 8/1990 | Minemura et al. | .............. | 439/82 |
| 5,073,119 A * | 12/1991 | Soes | ................................ | 439/82 |
| 6,062,916 A * | 5/2000 | Gladd et al. | .................. | 439/751 |
| 6,352,436 B1 * | 3/2002 | Howard | .......................... | 439/82 |
| 6,602,080 B1 * | 8/2003 | Gu | ................................... | 439/82 |
| 6,764,318 B1 * | 7/2004 | Fajardo | .......................... | 439/82 |
| 6,875,032 B2 * | 4/2005 | Tsuchiya | ......................... | 439/82 |
| 7,025,639 B2 * | 4/2006 | Aoki et al. | .................... | 439/751 |
| 7,083,434 B1 * | 8/2006 | Blossfeld | ........................ | 439/82 |
| 7,249,981 B2 * | 7/2007 | Chen | ............................. | 439/751 |
| 7,377,823 B2 * | 5/2008 | Chen | ............................. | 439/751 |
| 7,722,413 B2 * | 5/2010 | Tonosaki | ....................... | 439/751 |
| 2001/0041467 A1 | 11/2001 | Kikuchi et al. | ................. | 439/82 |
| 2004/0242033 A1 * | 12/2004 | Hu | .................................. | 439/82 |
| 2005/0054225 A1 * | 3/2005 | Zhang | ............................. | 439/82 |
| 2006/0264076 A1 * | 11/2006 | Chen | ............................. | 439/82 |
| 2007/0270001 A1 * | 11/2007 | Matsumura | ..................... | 439/82 |
| 2008/0227315 A1 * | 9/2008 | Banno et al. | .................... | 439/82 |

FOREIGN PATENT DOCUMENTS

GB    1060271    3/1967
GB    2 185 644 A    7/1987

* cited by examiner

*Primary Examiner* — T C Patel
*Assistant Examiner* — Harshad C Patel
(74) *Attorney, Agent, or Firm* — Harrington & Smith

(57) ABSTRACT

The invention relates to contact pins for providing an electrical connection between electronic devices. In one aspect the pin is adapted to be inserted into a hole of a circuit carrier and the pin comprises at least three portions; namely a contact termination portion, an electrical contact portion and a mechanical fastening portion. The mechanical fastening portion preferably allows a fastening of the contact pin without any soldering.

4 Claims, 13 Drawing Sheets

CONNECTION DEVICE

1. FIELD OF THE INVENTION

The present invention relates to a device for providing an electrical connection between electronic devices, in particular a solder-less connection. The invention further relates to a system and a method for providing such an electrical connection.

2. BACKGROUND OF THE INVENTION

From the art, several types of circuit carriers are known. A circuit carrier consists basically of a substrate of a dielectric material, which is provided with electrically conductive tracks, to connect electronic components. One type of circuit carrier are so-called MIDs (MID=Molded Interconnect Device), which are three-dimensional molded circuit carriers. MIDs are injection three-dimensional molded parts, with integrated circuit tracks. MIDs are molded from thermoplastic material as e.g. polypropylene (PP), polycarbonate (PC), polyamide (PA). In the art, there are several manufacturing processes known to produce MIDs. One method is e.g. the so-called hot embossing. In this method, first the dielectric substrate is molded from a thermoplastic material. After that, a copper foil is arranged on the surface of the dielectric substrate and substrate and copper foil are arranged in a press. In the next step, a heated dye with an engraved circuit pattern for embossing is pressed onto the copper foil. After that, the excess foil is removed from the thermoplastic substrate and the plated MID is ready for application.

Printed circuit boards are another very common type of circuit carrier. Printed circuit boards are widely used in the industry to mechanically support and electrically connect electronic components. PCBs consist of a dielectric substrate, the board, which is provided with conductive pathways or tracks, which are usually cut from copper sheets and are laminated onto the board. The substrates of PCBs are usually made from fiber-reinforced epoxy resins. Epoxy resins have excellent mechanical properties with regard to hardness and they provides good chemical and heat resistance. In printed circuit boards, the application of contact pins to provide an electrical connection between electronic components is very common. For the reception of such contact pins, the printed circuit boards are provided with throughholes, whereby the inner surface of the throughholes is provided with an electrically conductive coating. The electrically conductive coating of the throughhole is in contact with one or more of the conductive tracks provided on the board. The contact pins are then inserted into the throughholes and are subsequently soldered to fasten the contact pins with the board and to provide an electric connection. In the industry, the large-scale soldering of PCBs is usually done by means of wave-soldering, whereby the contact pins are inserted into the PCB and the PCB is then passed with its underside over a standing wave of solder. The solder wets the metallic areas of the board, creating a reliable mechanical and electrical connection. In the art, it is further known to mount contact pins by means of press-fit into a PCB. This is possible since the epoxy resins used for PCBs are very hard, so that the press-fit of a metallic contact pin does not widen or enlarge the hole provided in the PCB. However, with such press-fits, very tight tolerances have to be observed.

To avoid the very high production tolerances necessary for a press-fit, i.e. for the contact pin and the corresponding hole in the PCB, contact pins with spring-like compressible profiles were developed. If such a pin is pressed into a corresponding hole in a PCB, the compressible or spring-like section of the pin is deformed and may be fitted into the hole.

The present invention relates to a contact pin for providing electrical connection between electronic devices, which pin is adapted to be installed in the hole of a circuit carrier, in particular of a circuit carrier made of a thermoplastic material, such as MID.

In particular, it is an object of the invention to provide a cost-efficient, mechanically stable contact pin for electrical connection between electronic devices. It may be a further object of the invention to provide a contact pin, which provides a solder-less electrical connection and which is adapted to be inserted into a hole of a circuit carrier, in particular an MID. It may be still a further object of the invention to provide a contact pin, which may be used with thermoplastic materials, and which may in particular be fastened in holes provided in thermoplastic substrates without widening or destroying the related hole and/or which may compensate for production tolerances or deformations commonly occurring in the thermoplastic substrate due to mechanical or thermal stress. It may be a further object to provide a contact pin, which may be fastened in thermoplastic material without getting loose, when the thermoplastic material is subjected to creep over time or under the influence of temperature as it is common for such thermoplastic materials. It may be a further object of the invention to provide an improved system for connecting electronic devices, wherein contact pins can be mounted into holes provided in the dielectric substrate of a circuit carrier.

It is another object of the invention to provide a system for connecting electronic devices comprising contact pins, which are inserted into holes in circuit carriers. At least one of these and other objects, which will derive from the following description, are solved by the present invention.

3. SUMMARY OF THE INVENTION

According to one embodiment of the invention, a contact pin for providing an electrical connection between electrical devices is provided, which is adapted to be inserted into a hole of a circuit carrier, preferably a circuit carrier made from a thermoplastic material, in particular an MID. The contact pin comprises at least three portions, a contact termination portion, an electrical contact portion, and a mechanical fastening portion. The mechanical fastening portion serves to secure the contact pin in the hole of the circuit carrier, in which the contact pin is to be inserted. The mechanical fastening portion is preferably provided on one end of the contact pin and it may preferably provide an elastic fastening, e.g. by means of spring-like elements, or a rigid fastening, by e.g. harpoon like elements. Elastic fastening elements serve to compensate for production tolerances or deformations occurring in the circuit board due to mechanical or thermal stress. The electrical contact portion serves for the electrical contact between the contact pin and the circuit carrier, into which the contact pin is to be inserted and is preferably provided with elastic contact means. In this way it is possible to compensate for production tolerances or deformations occurring in the circuit board due to mechanical or thermal stress. Preferably, the electrical contact portion of the contact pin is, when inserted into a hole of the contact carrier, in electrical contact with at least one of the tracks provided on the circuit carrier. The electrical contact portion is preferably provided next to the mechanical fastening portion. The contact termination portion provides electrical contact between the contact pin and an electronic device, thus establishing an electrical connection between the circuit carrier into which the contact pin is inserted, and one or several electronic devices. Preferably, all three portions are separate from each other, i.e. they are provided on the same pin but on different sections thereof. However, it should be clear that the portions may overlap each other to some extent and may still be distinguishable from each other. The contact termination portion may be provided on any one side or on both sides of the contact pin.

Due to the structure of the contact pin, it is possible to establish an electrical connection without the necessity of any soldering between contact pin and circuit carrier. The mechanical fastening portion is preferably adapted to secure the contact pin in a relatively soft thermoplastic material of e.g. a MID. At the same time, the electrical contact portion of the contact pin establishes a secure and satisfying electrical connection between contact pin and the circuit carrier, into which the contact pin is inserted.

In another aspect, the invention relates to a system for providing electrical connection between electronic devices. The system comprises at least one circuit carrier, which is provided with holes. The system further comprises at least one contact pin, whereby said holes in the circuit carrier are adapted for the reception of said contact pin. Further, at least the area around the hole is provided with means to establish an electrical connection, like e.g. a copper plating, metallic tracks, etc., such that, when the contact pin is inserted in one of the holes, the electrical contact portion of the pin is in electrical contact with the electrical contact means of the circuit carrier. The contact pin preferably comprises at least three portions, namely a contact termination portion, an electrical contact portion preferably adjacent the contact termination portion, and a mechanical fastening portion preferably adjacent the electrical contact portion. The circuit carrier is preferably an MID made from a thermoplastic material. Thermoplastic materials are relatively soft and subject to creep under pressure and temperature such that a conventional press-fit contact pin is not suitable for a secure fastening and a reliable electric contacting. The mechanical fastening portion of the contact pin is therefore provided with mechanical means to fasten the contact pin securely in the hole of the thermoplastic circuit carrier, like the MID. In a most preferred embodiment, the electrical contact portion and the mechanical fastening portion of the contact pin are provided such that no soldering is necessary, to establish mechanical and electrical connection between contact pin and MID. This is achieved by spatially separating the electrical contact portion from the mechanical fastening portion of the contact pin. In this way, it is possible to form each portion such that it has the optimum shape required for its respective function. Since the electrical contact portion is separate from the mechanical fastening portion, it is not necessary to fully plate the hole, where the contact pin is inserted. The plating to provide electrical connection may only be provided on the surface of the MID around the respective hole, where the contact pin is inserted. The electrical contact portion of the contact pin is shaped such that it is in contact with the plating on the surface of the MID, when the pin is fully inserted into the respective hole. In a most preferred embodiment, the entrance of the hole is funneled and the funnel surface is plated. The electrical contact portion of the contact pin is provided with a corresponding shape, such that when the contact pin is inserted into the hole, the electrical contact portion of the pin rests on the funnel surface and provides a relatively large electrical contact area.

Another aspect of the invention is a new method for establishing electrical connection between electronic devices. The method comprises the steps of providing at least one circuit carrier, and in particular a MID made from a thermoplastic material. The circuit carrier comprises holes for the reception of contact pins. The holes may be provided as throughholes. The contact pins comprise preferably at least three portions: A contact termination portion, an electrical contact portion preferably adjacent to the contact termination portion, and a mechanical fastening portion preferably adjacent to the electrical contact portion. The mechanical contact portion of the contact pin is preferably adapted to secure the contact pin inside of one of the holes of the circuit carrier without the necessity for any soldering.

The contact pins may be rotationally symmetrical around their respective longitudinal axis. Preferably the contact pins are flat elements, which may be cut out from a piece of sheet metal. In this case the sheet metal may have a thickness of 0.2 to 1 mm, preferably of 0.2 to 0.3 mm.

4. DETAILED DESCRIPTION OF PREFERRED EMBODIMENTS

In the following, preferred embodiments are exemplarily described with reference to the enclosed figures, wherein FIG. 1 is a schematic sectional view of different contact pins inserted into a circuit carrier;

Figure 1:
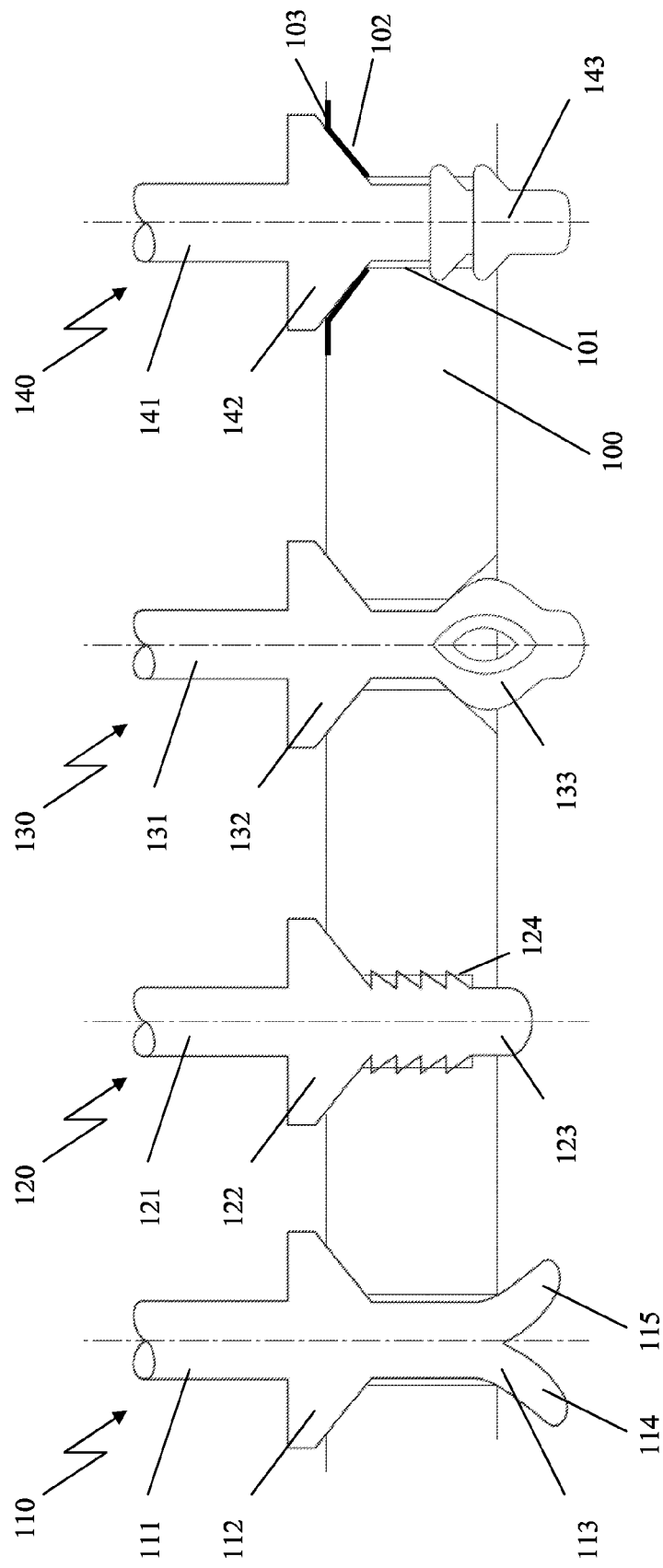

FIG. 1 shows a circuit carrier 100, like e.g. a printed circuit board, but it is preferably a MID made from thermoplastic material. The circuit carrier 100 is provided with throughholes 101 extending from an upper surface to a lower surface of the circuit carrier. The entrance of the throughhole 101 on the upper surface of the circuit carrier 100 is provided in the shape of a funnel 102 outwardly oriented with regard to the circuit carrier itself. The walls of the funnel 102 are plated with a conductive plating 103, which is e.g. a copper plating. Plating 103 is in contact with conductive tracks (not shown), which are provided on the circuit carrier to establish an electrical connection between electronic devices. Into the holes 101, contact pins 110, 120, 130 and 140 are inserted. Each contact pin comprises three portions, namely a contact termination portion 111, 121, 131 and 141; an electrical contact portion 112, 122, 132, and 142; and a mechanical fastening portion 113, 123, 133 and 143. As can be seen from FIG. 1, the contact termination portions and electrical contact portions of each contact pin are similar but the mechanical fastening portions 113, 123, 133 and 143 are different from each other. The electrical contact portions have either a cone or a wedge shape which corresponds to the funnel 102 provided on the entrance of holes 101 in the circuit carrier 100. The cone shaped electrical contact portion contacts the conductive plating 103 which corresponds to an outwardly oriented surface (i.e. different from the internal cylindrical surface of the hole 101) of the circuit carrier 100. The conductive plating 103 is provided on the walls of the funnel 102. Since the contact pins are made from an electrical conductive material or are plated or covered with an electrical conductive material, an electrical connection between the contact pins and the circuit carrier 100 can be established. The contact termination portions serve to establish the connection with further electronic devices (not shown) and may e.g. be adapted to receive corresponding electrical cables or wires, which may be fastened to the contact termination portions.

In the following, the different mechanical fastening portions of the contact pins of FIG. 1 are explained in more detail.

Contact pin 110 is provided with a fastening portion 113. The fastening portion 113 is provided with at least two bendable, preferably non elastic arms 114 and 115, which project from the lower surface of circuit carrier 100, when the pin is fully inserted. In its original form, the arms 114, 115 are arranged parallel to each other, so that the pin may be inserted into its hole. After insertion of the pin the arms 114, 115 are spread apart into the arrangement shown in FIG. 1, to form a positive locking of contact pin 110 inside of the hole. This may be done with a special tool, but a screw driver is e.g. also suitable. In this way, preferably neither any press fit nor any soldering is necessary. The fastening portion 123 of contact pin 120 has a number of barb-like elements 124. The elements 124 cut to some extent into the inner wall of the throughhole, such that contact pin 120 is securely fastened. The barb-like elements are orientated such that the pin may be inserted into its respective hole but can not be pulled out again. Again, due to the barb-like elements 124, neither any press fit nor additional soldering is necessary to secure the contact pin in the hole.

The fastening portion 133 of contact pin 130 shows another embodiment of a fastening means. The fastening portion 133 is provided with a variable cross-section, which cross-section is in its original form narrow and provided with a slit. In its original, not-deformed shape the contact pin 130 can be inserted into hole 101 of circuit carrier 100. After inserting into the hole the slit is widened by means of e.g. a suitable tool, such that the shape shown in FIG. 1 is created. As can be seen from FIG. 1, both sides of the throughhole, into which contact pin 130 is inserted, are provided with a funnel. When contact pin 130 is fully inserted into its hole, the mechanical fastening portion 133 with variable cross-section spreads apart and secures the contact pin in its throughhole.

Contact pin 140 is provided with another mechanical fastening portion 143. The mechanical fastening portion 143 consists of two embossments or bulges which are shaped such that contact pin 140 may easily be inserted but the form of the bulges prevent a removal of pin 140 against the insertion direction. To provide for an even better fastening, the lower of the two bulges may for example project from the throughhole and be in positive locking with the underside of the circuit carrier 100. The funnel shape compensates for production tolerances or deformations occurring in the circuit board due to mechanical or thermal stress.

Figure 2:
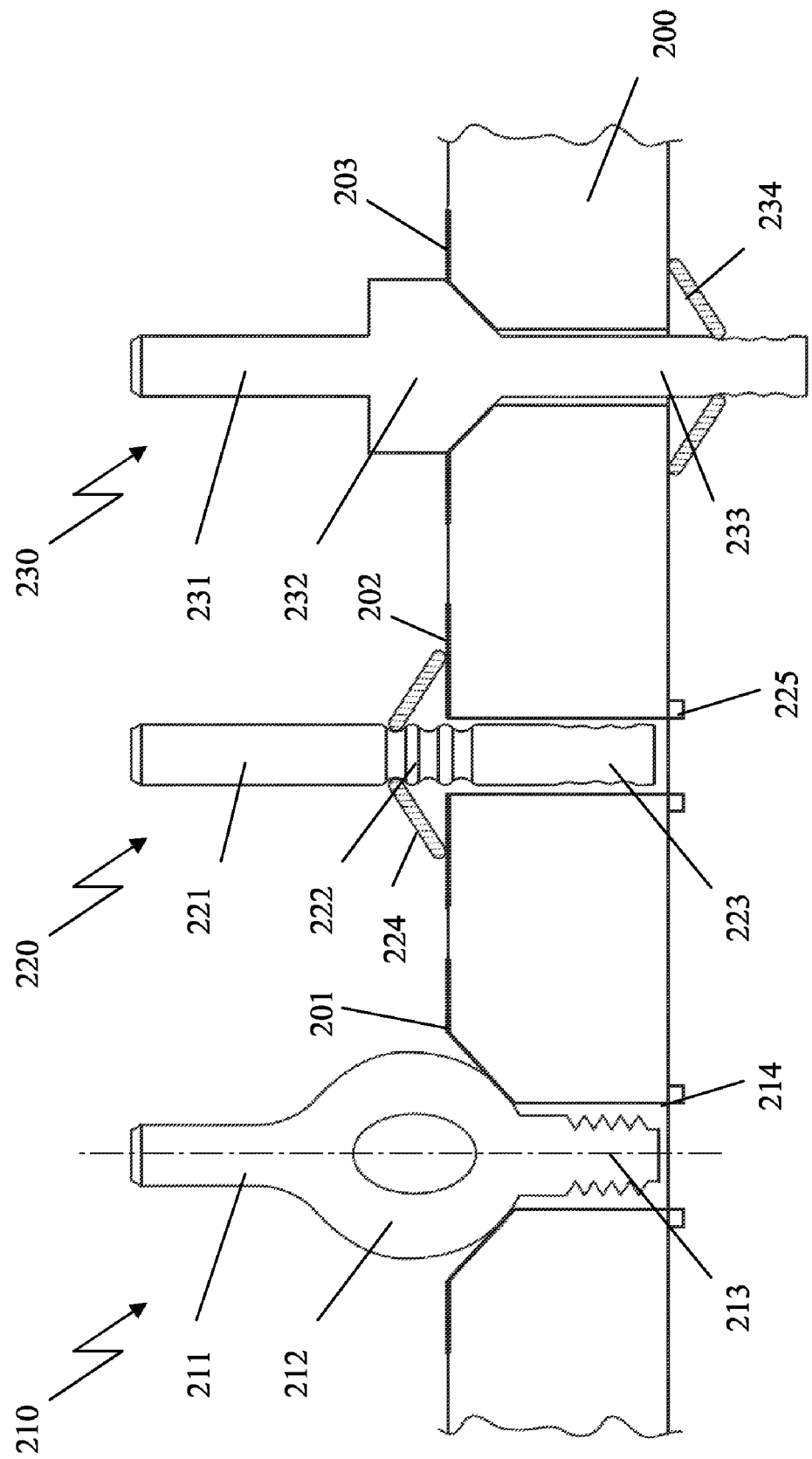
FIG. 2 is another sectional view of different contact pins.

FIG. 2 shows three further examples of different contact pins and their fastening and arrangement with a circuit carrier 200. In FIG. 2, the circuit carrier 200 is shown in a sectional view, and the circuit carrier is provided with throughholes into which contact pins 210, 220 and 230 are inserted. Each contact pin has basically three portions, an upper contact termination portion 211, 221, and 231, an electrical contact portion 212, 222 and 232, adjacent to the contact termination portion, and a mechanical fastening portion 213, 223 and 233 adjacent to the contact portions. The area around the throughholes is plated by means of platings 201, 202 and 203. The platings are in contact with the electrical contact portions of the contact pin as can be seen from FIG. 2. Each contact pin is provided with a different mechanical fastening means.

Contact pin 210 is provided with a mechanical fastening portion 213 with a toothed profile. When the contact pin 210 is inserted into its throughhole, plastic material 214 is locally heated respectively melted and pushed into the locking shape of the pin, such that the space between the inner sidewalls of the through-hole and the fastening portion 213 is preferably completely filled with plastic material. After solidifying the contact pin is firmly held in its respective hole. This process may also be done by means of a heat source as e.g. a laser, an ultrasonic or a hot stamp or similar. Plastic material 214, 225 around the hole is molten to some extend. The molten plastic material flows or moves into the gap between the pin and the inner wall of the hole to provide a secure fastening between pin and circuit carrier. Plastic material 214, 215 may be provided as surplus material as it is shown in FIG. 2 but it is also possible to use the material around an ordinary hole, like e.g. around the hole of example pin 230.

Contact pin 220 comprises a disk spring 224, which serves at the same time for electrical connection between the plating 202 and the contact portion 222 of the contact pin. The contact pin 220 then comprises an electrical contact element, the disk spring 224, that has a contact surface adapted for contacting an outwardly oriented conducting surface of the circuit carrier 100. In this example this conducting surface may be parallel to the main surface of the circuit carrier 100. The fastening portion 223 of contact pin 220 is similar to the fastening portion of pin 210.

Pin 230 is also provided with a disk spring 234, but in the case of pin 230, the disk spring 234 serves for a mechanical fastening of the contact pin in its throughhole. The fastening portion 233 is provided with corresponding grooves or constrictions, as can be seen from FIG. 2, around which the disk spring 234 is fitted. The contact pin 230 is easily inserted into its throughhole from a first side of the circuit carrier 200, then the disk spring 234 is inserted on the fastening portion 233 from the other side and prevents the contact pin from being removed from its throughhole. The elastic properties of the spring elements compensate for production tolerances or deformations occurring in the circuit board due to mechanical or thermal stress, as it constantly urges the electrical contact portion 232 against the plating 203.

Figure 3:
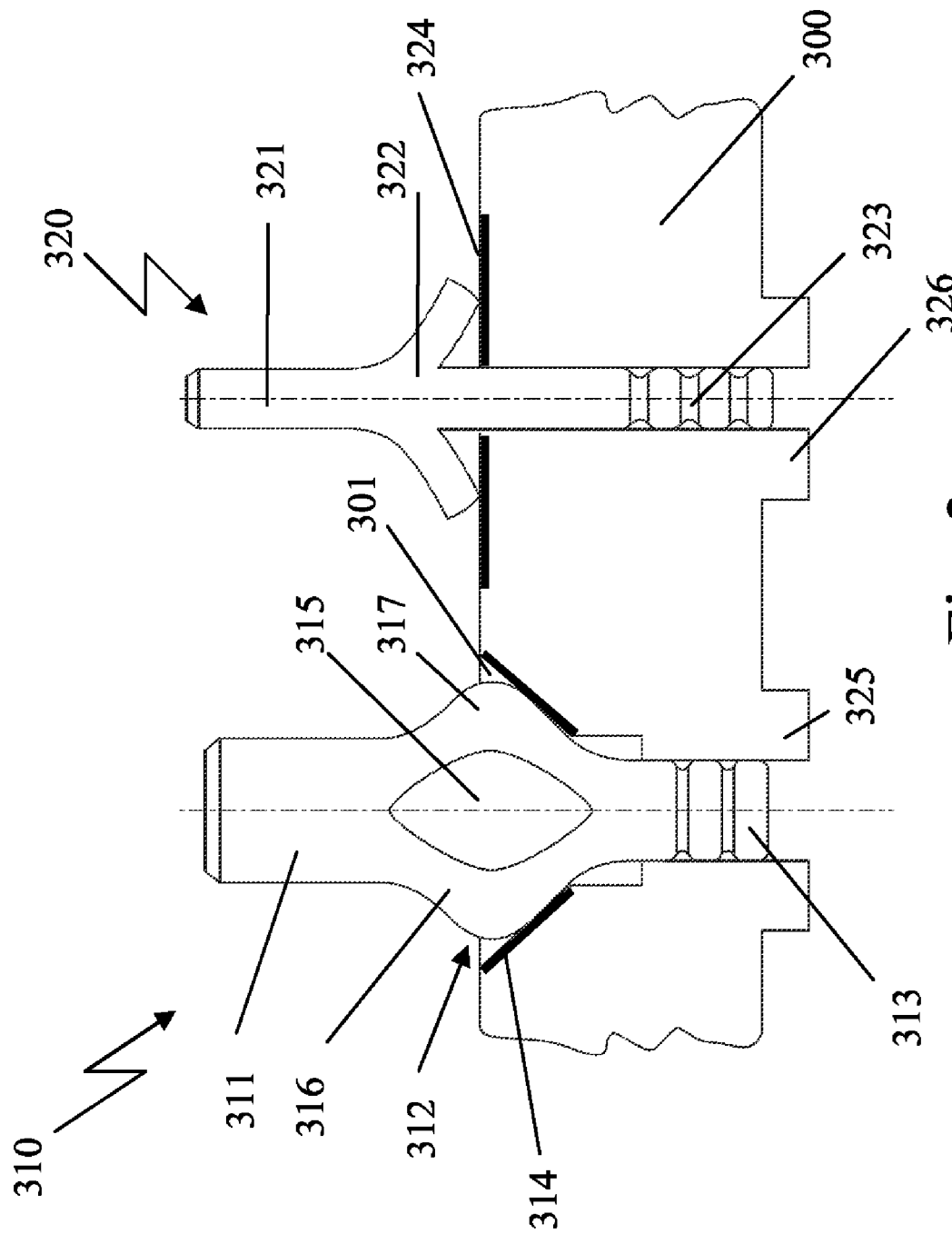
FIG. 3 is yet another sectional view of further embodiments of contact pins.

FIG. 3 shows two further embodiments of contact pins and their arrangement in a circuit carrier 300. The contact pins 310, 320 have similar fastening portions 313, 323 and similar contact termination portions 311 and 321. Contact pin 310 is provided with an electrical contact portion 312, which is provided with a hole 315 and at least two contact arms 316, 317, which are curved and rest on a funnel 301 provided in the upper surface of circuit carrier 300. The walls of the funnel 301 are provided with an electric conductive plating 314, which establishes an electrical connection between the circuit carrier 300 and the arms 316, 317 of the contact pin 310. The expression "to establish an electrical contact with the circuit carrier" as used herein means more precisely an electrical contact with electrical tracks provided on the circuit carrier 300. Contact pin 320 is provided with a contact portion 322, which has spring characteristics, but which is integrated with the contact pin 320, and may have a disk like form or advantageously a form with two wings, as can be seen in FIG. 3. The spring contact portion 322 is biased against an electrical plating 324 provided on the upper surface of circuit carrier 300. In this way, a secure electrical connection between contact pin 320 and plating 324 is provided. Also in the embodiments shown in FIG. 3 plastic material 325, 326 around the through-hole may be molten for secure connection and attachment as described above.

Figure 4:
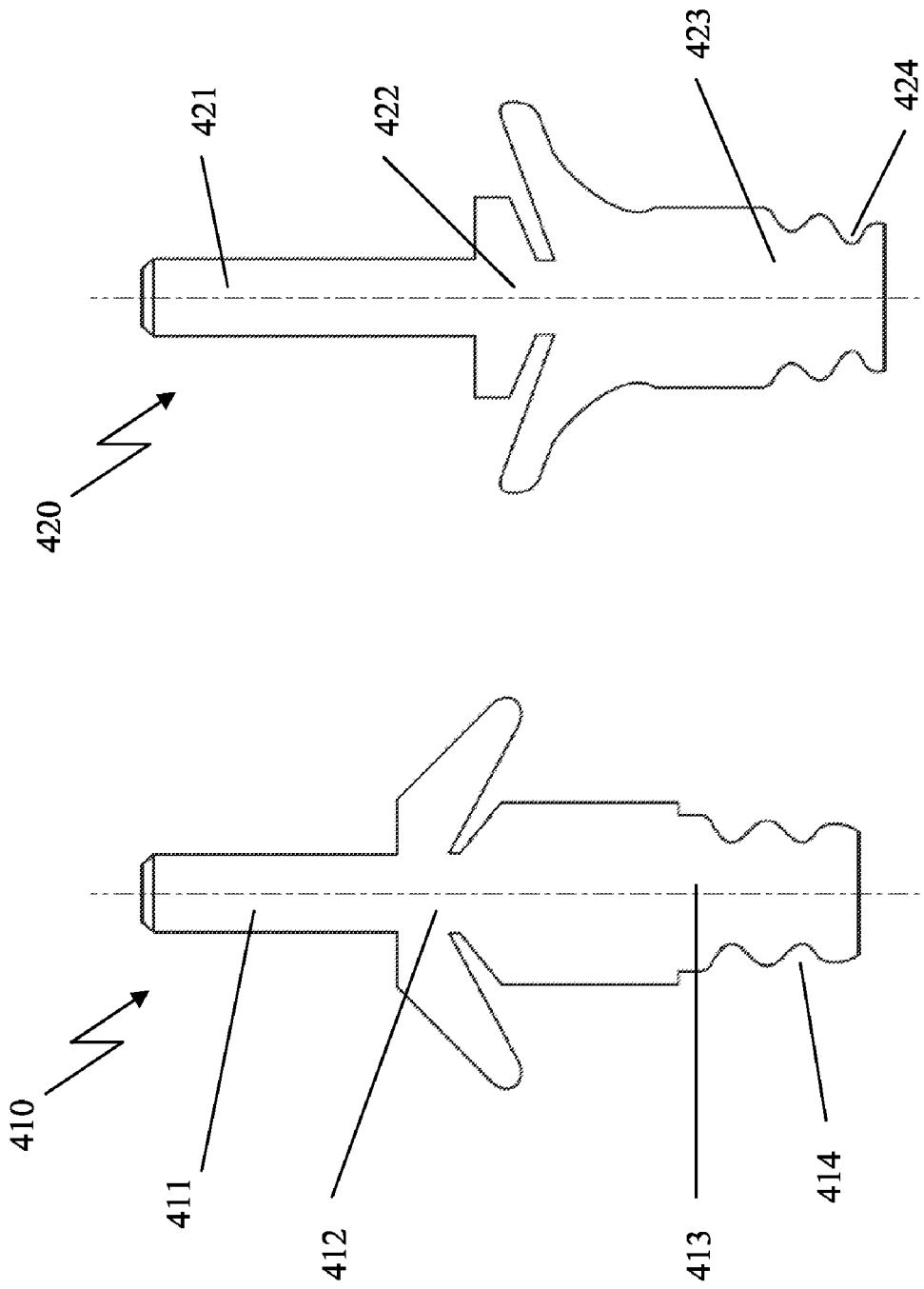
FIG. 4 is a schematic drawing of certain embodiments of contact pins.

FIG. 4 shows two contact pins 410, 420 in a schematic view. Both contact pins are provided with contact termination portions 411, 421; electrical contact portions 412, 422 and mechanical fastening portions 413, 423. The mechanical fastening portions 413, 423 are adapted to be inserted into a throughhole of a circuit carrier, like e.g. a MID. After contact pins 410, 420 are inserted in respective throughholes, the plastic material around the edge of the hole is molten to some extend as it was described above to securely fasten contact pins with the circuit carrier. To achieve a better connection with the molded material, the mechanical fastening portions of the contact pins are provided with a number of constrictions 414, 424 into which the molded plastic is pressed. The electrical connection is provided by the contact portions 412 and 422. The contact portion 412 is provided in the form of a spring disk, such that when a contact pin 410 is fully inserted into its throughhole, the disk spring is biased against the surface of the circuit carrier, respectively against a suitable plating provided on the circuit carrier and compensates for production tolerances or deformations occurring in the circuit board due to mechanical or thermal stress. The contact portion 422 of contact pin 420 is adapted to correspond to a funnel shape, which is provided into the circuit carrier, such that a large contact area can be provided.

Figure 5:
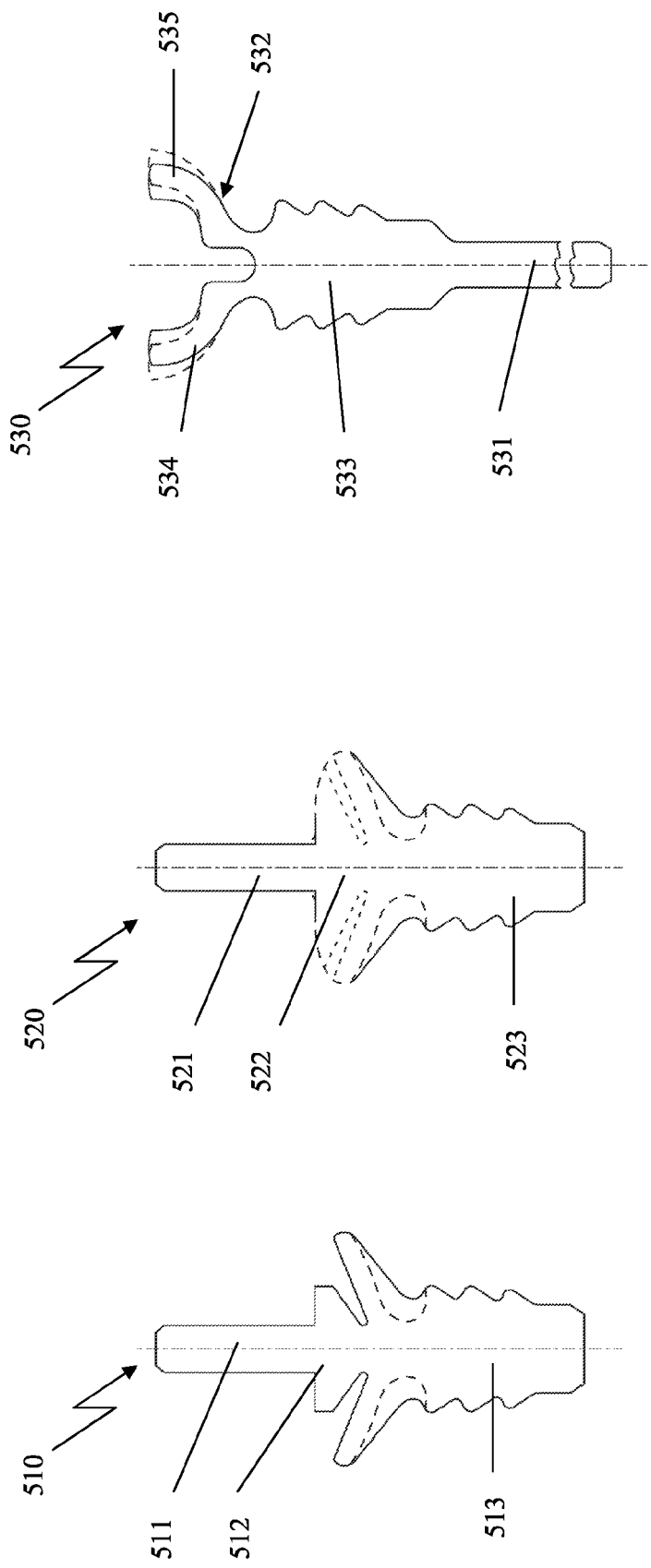
FIG. 5 is a schematic view of further embodiments of inventive contact pins.

FIG. 5 shows in a schematic view three further embodiments of inventive contact pins 510, 520 and 530. The contact pins depicted in FIG. 5 have similar mechanical fastening portions 513, 523 and 533. The fastening portions are of the harpoon type and have circumferential barbs, that may cut into the inner sidewalls of holes provided in a circuit carrier. Due to the orientation of the barbs, the contact pins 510, 520 and 530 may easily be inserted in one direction, but the barbs prevent a removal of the contact pins against the insertion direction. Contact pins 510, 520 have contact termination portions 511 and 521 provided above the electrical contact portions 512 and 522. The electrical contact portions may be as indicated by the dashed lines, to adjust some kind of spring-function, which allows to bias the contact portions against the circuit carrier, as it is explained in more details in reference with FIGS. 8 and 9. Contact pin 530 differs in this respect, in that the contact termination portion 531 is provided on the lower end of contact pin 530, next to the mechanical fastening portion and the electrical contact portion 532 is provided on the opposite end of contact pin 530. The electrical contact portion 532 is provided in the form of at least two spring arms 534 and 535. When contact pin 530 is inserted in the hole of a circuit carrier, the arms 534 and 535 rest against the walls of a corresponding funnel provided on the entrance of the hole, and the arms 534, 535 are biased against the walls of the funnel, to provide a good electrical contact (unbiased condition is indicated by dashed lines).

Figure 6:
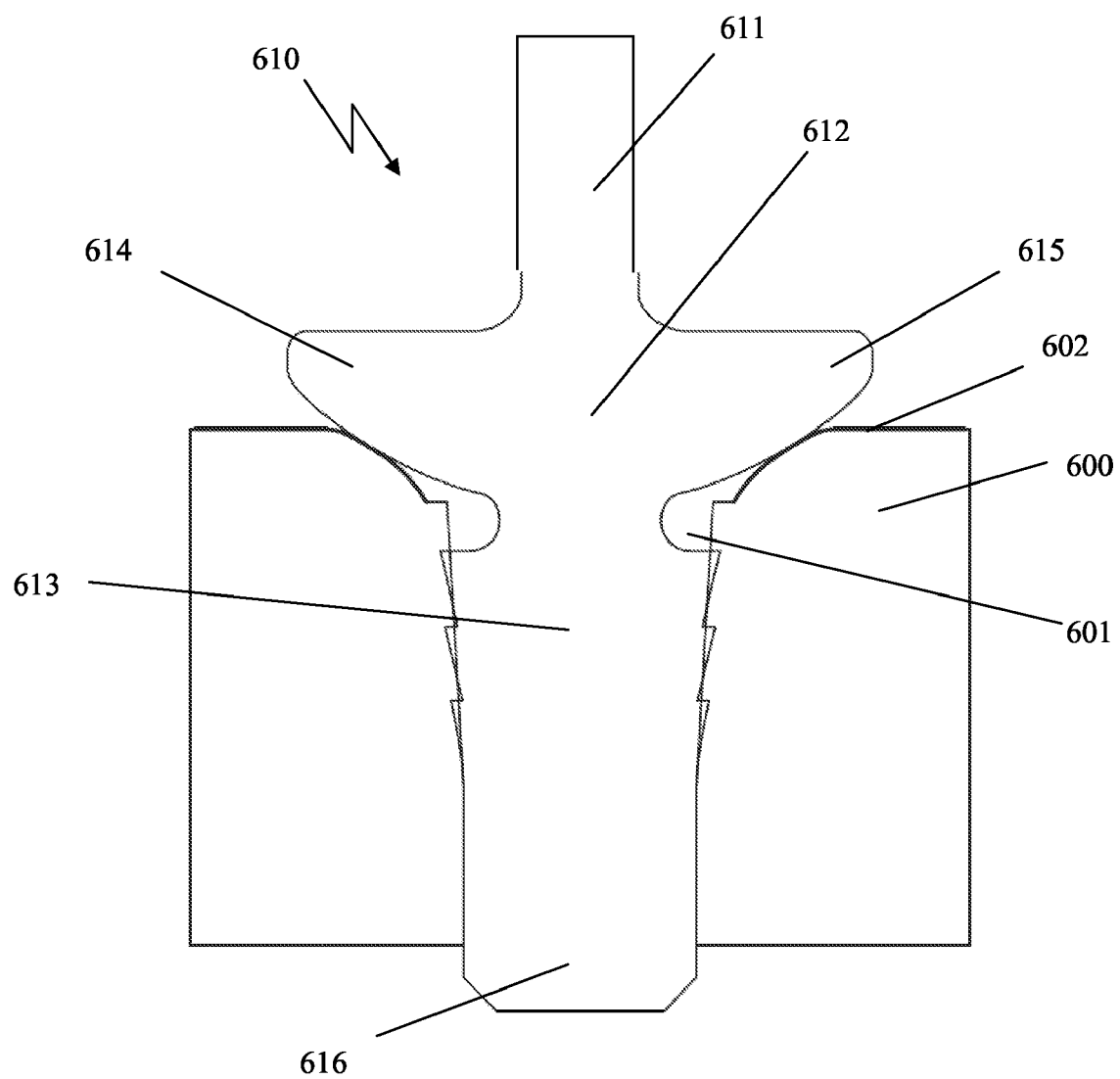
FIG. 6 is a detailed schematic view of the fastening of a contact pin in a hole in a circuit carrier.

FIG. 6 shows a schematic detail of a further contact pin 610, which is inserted into a hole 601, which is provided in a MID 600. The contact pin 610 has a contact termination portion 611, an electrical contact portion 612, and a mechanical fastening portion 613. The mechanical fastening portion 613 is of the harpoon type and provides a mechanical anchorage in the thermoplastic material of the MID. The electrical contact portion 612 can be provided in the form of at least two wings 614, 615, which rest against the surface of the MID 600 surrounding the throughhole 601, or it can be on single cylindrical portion. In the latter case the pin is preferably provided in the form of a rotationally symmetrical element. The surface of the MID 600 around the throughhole 601 is provided with conductive tracks 602. As can be seen from FIG. 6, the conductive tracks 602 provide an electrical contact zone at the entrance of throughhole 601. The inner sidewalls of throughhole 601 remain for the most part unplated and can thus serve to anchor the mechanical fastening portion 613 of the contact pin 610. In the embodiment of contact pin 610 shown in FIG. 6, the contact pin is provided with a further possible pin contact termination 616, underneath the harpoon-like mechanical fastening portion 613. In this way, it is possible to connect an electronic device at two opposite positions, either at the upper side of MID 600 or at the underside of MID 600. It is of course possible to use both contact termination portions 611, 616 or only one of said portions.

Figure 7:
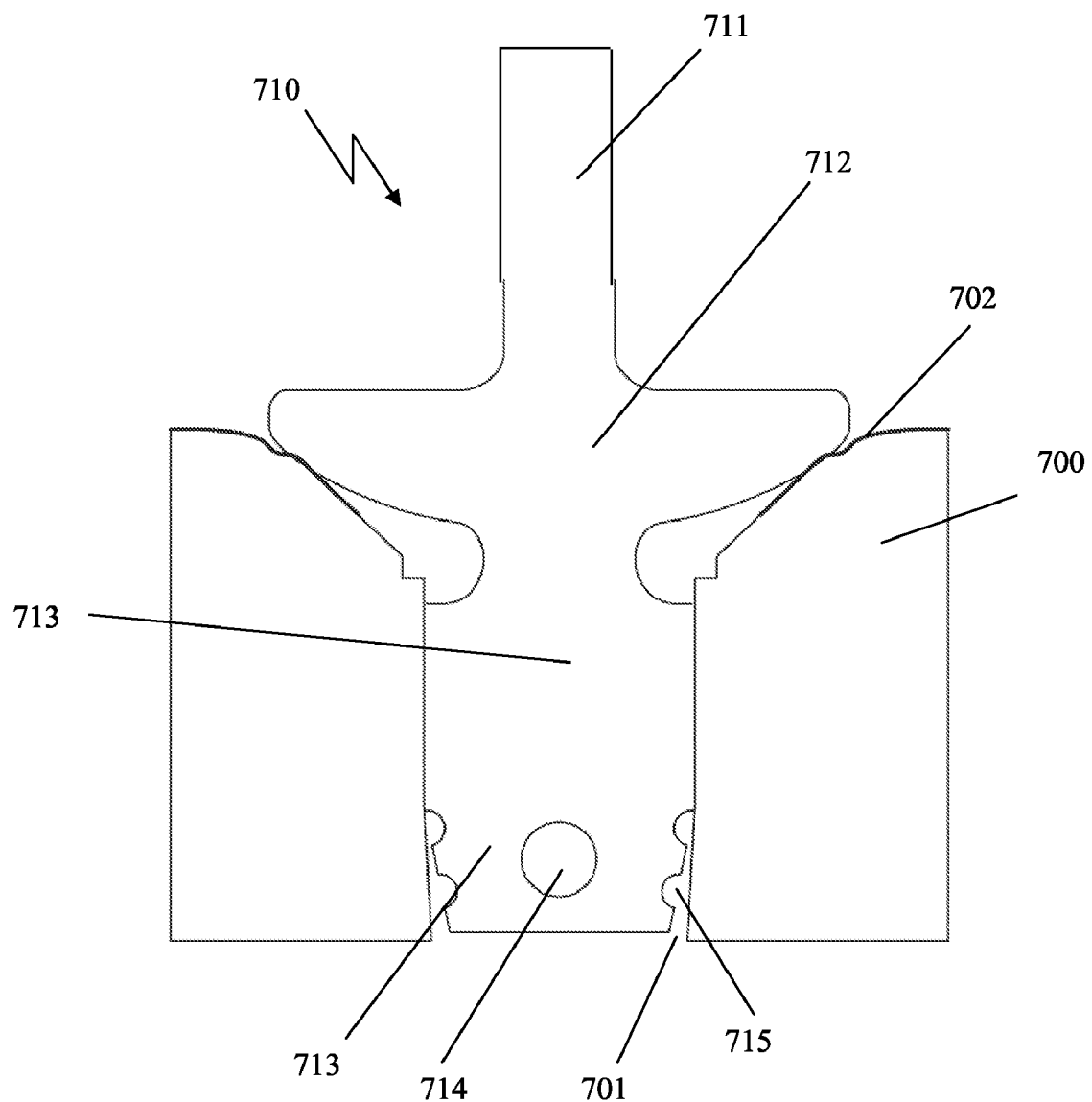
FIG. 7 is a similar view as FIG. 6 showing another embodiment of contact pins.

FIG. 7 shows another embodiment of a contact pin 710, which is inserted in a throughhole 701 of a MID 700. The pin 710 has a contact termination portion 711, an electrical contact portion 712 and a mechanical fastening portion 713. The mechanical fastening portion 713 is provided with cavities 714 and 715 for the reception of molten plastic material. Thus, the mechanical anchorage of contact pin 710 is achieved by injecting molten plastic material from the underside of MID 700 into the remaining space of throughhole 701. In this way, a secure mechanical anchorage between contact pin and MID is provided. The electrical connection between contact pin and MID is provided by means of conductive tracks 702, which are arranged around the upper entrance of throughhole 701, and which extend for approximately 10% of the depth of the throughhole 701.

Figure 8:
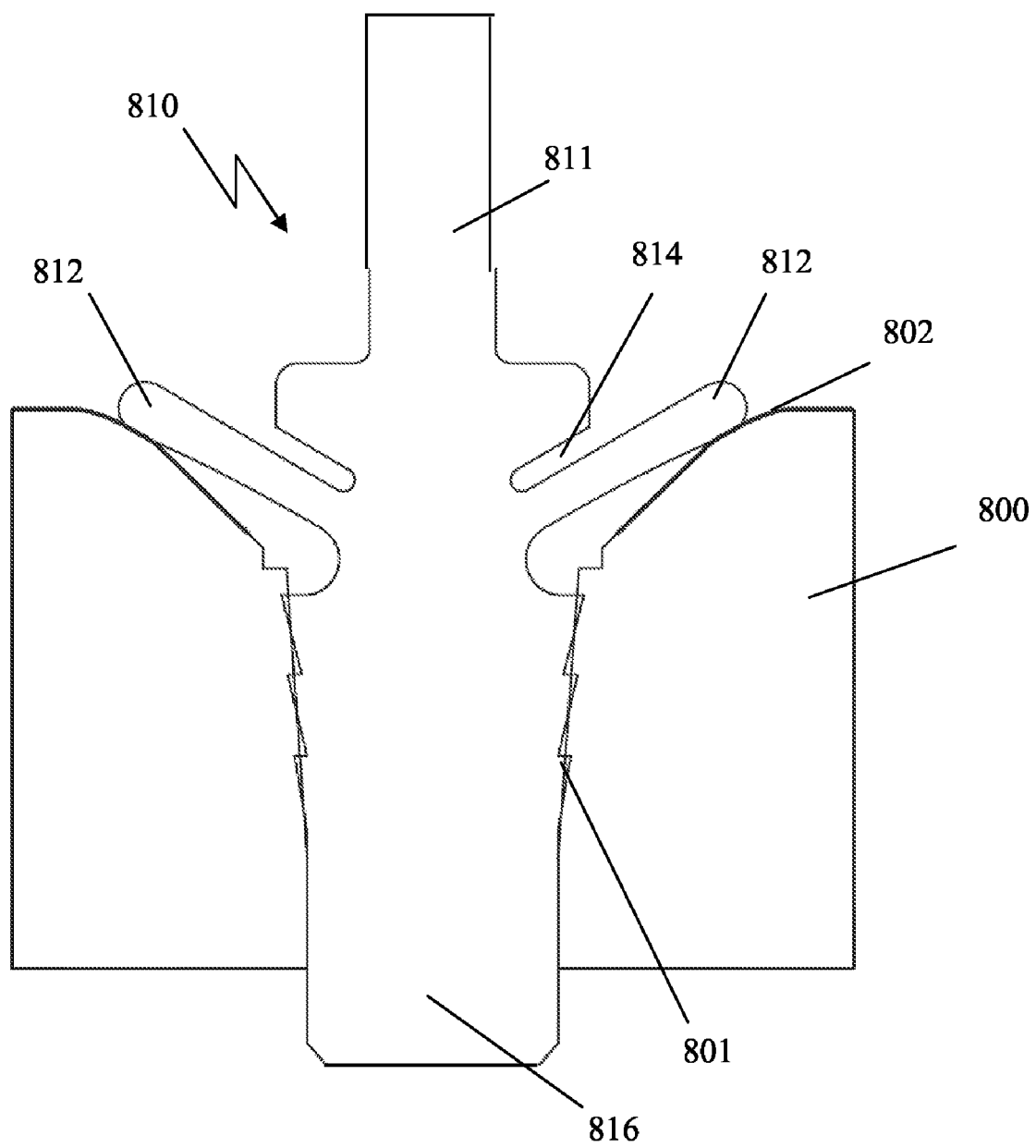
FIG. 8 is a similar view to FIG. 6, showing yet another different embodiment of contact pin.

FIG. 8 shows another embodiment of a contact pin 810, which is inserted in a MID 800. The contact pin 810 is again of the harpoon type. As can be seen from FIG. 8, the upper part of throughhole 801 is widened and has the shape of a funnel. The funnel walls are provided at least in the upper part of throughhole 801 with conductive tracks 802. The contact pin 810 is provided with elastic contact elements 812, which are biased against the conductive tracks 802, when contact pin 810 is inserted in the corresponding throughhole. In this way it is possible to compensate for production tolerances or deformations occurring in the circuit board due to mechanical or thermal stress. Also in the embodiment shown in FIG. 8, the contact pin has two possible contact termination portions 811, 816, one provided on the upper side of MID 800 and one underneath the MID 800. The contact pin 810 is further provided with two deformation control gaps 814. The deformation control gap serves as a positive stress or strain limitation, in other words the elements 812 can only be bent to a limited extend before abutting the block element provide on the opposite side of the gap 814.

Figure 9:
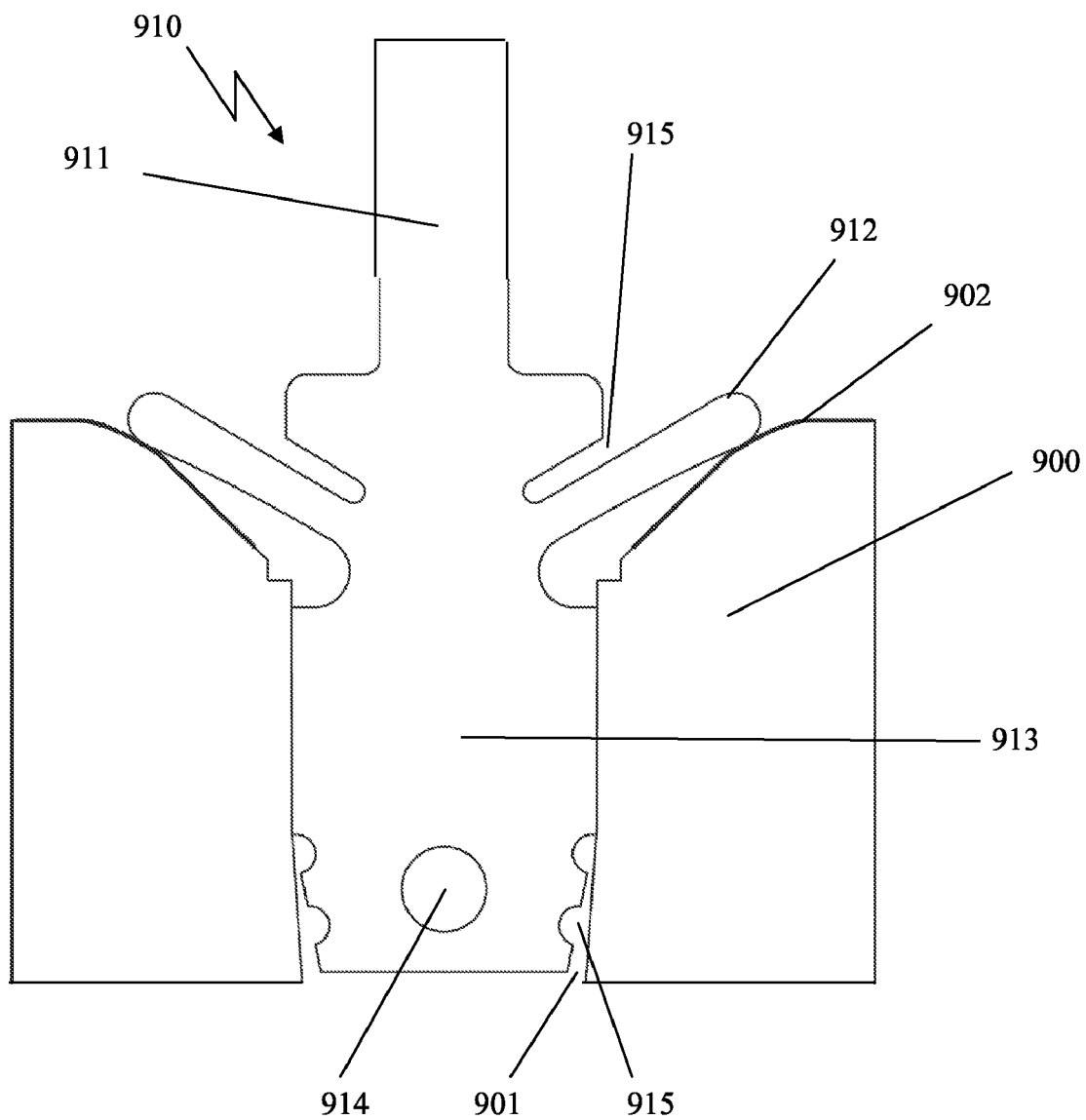
FIG. 9 is a similar view as FIG. 6 showing a further embodiment of a contact pin.

FIG. 9 shows a similar contact pin as FIG. 8, which is inserted into a throughhole 901 of a MID 900. The contact pin 910 has a contact termination portion 911, an electrical contact portion 912, and a mechanical fastening portion 913. The mechanical fastening is achieved by applying molded plastic material into the residual space of throughhole 901, which molten plastic material is pressed into cavities 914 and 915 provided in the mechanical fastening portion 913 and provides a secure mechanical fastening. The electrical connection is established by elastic contact elements 912 which abut against conductive tracks 902 provided in the upper part of throughhole 901. As can be seen from FIG. 9, the upper part of throughhole 901 has a funnel shape such that the electrical contact zone, where the elastic contact element 912 of contact pin 910 contacts the conductive tracks 902 of the MID 900, is enlarged. Also in the embodiment of FIG. 9, a deformation control gap 915 is provided as it was explained above with reference to FIG. 8.

Figure 10:
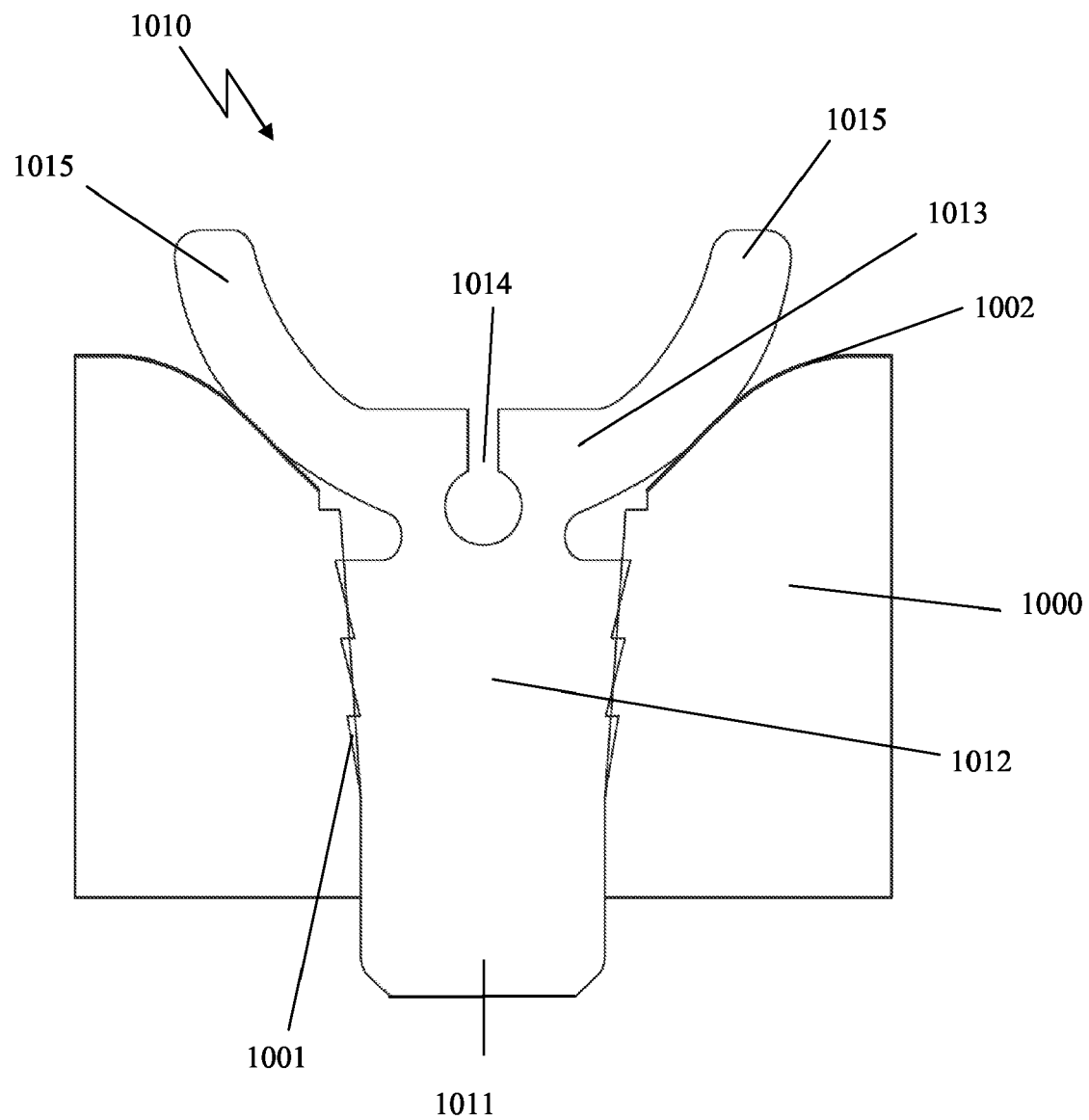
FIG. 10 is a similar view as FIG. 6, showing yet another embodiment of a contact pin.

FIG. 10 shows another embodiment of a contact pin 1010, which is inserted into a throughhole 1001 of a MID 1000. Contact pin 1010 is provided with an electrical contact portion 1013, a mechanical fastening portion 1012 of the harpoon type and a contact termination portion 1011. In the embodiment of FIG. 10 the contact termination portion is exemplarily provided on the lower end of the pin. The electrical contact portion 1013 comprises two elastic contact elements 1015 which abut and are preferably biased against an electrical contact zone, which is provided by conductive tracks 1002. The elastic contact elements 1015 are arranged in the form of a "Y". Also the embodiment of FIG. 10 is provided with a deformation control gap 1014.

Figure 11:
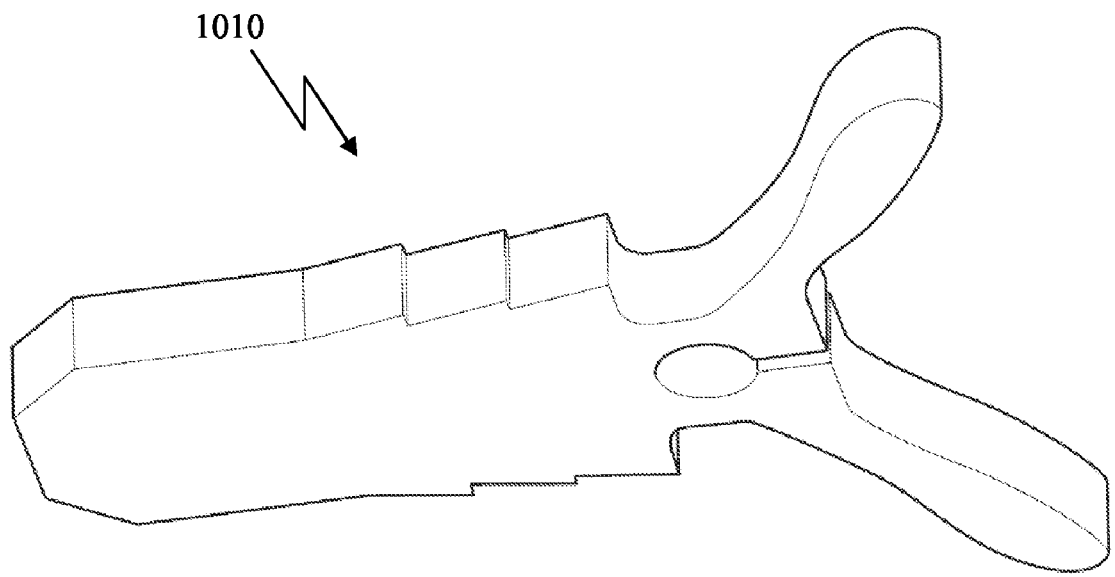
FIG. 11 is a schematic view of the contact pin shown in FIG. 10.
Figure 12:
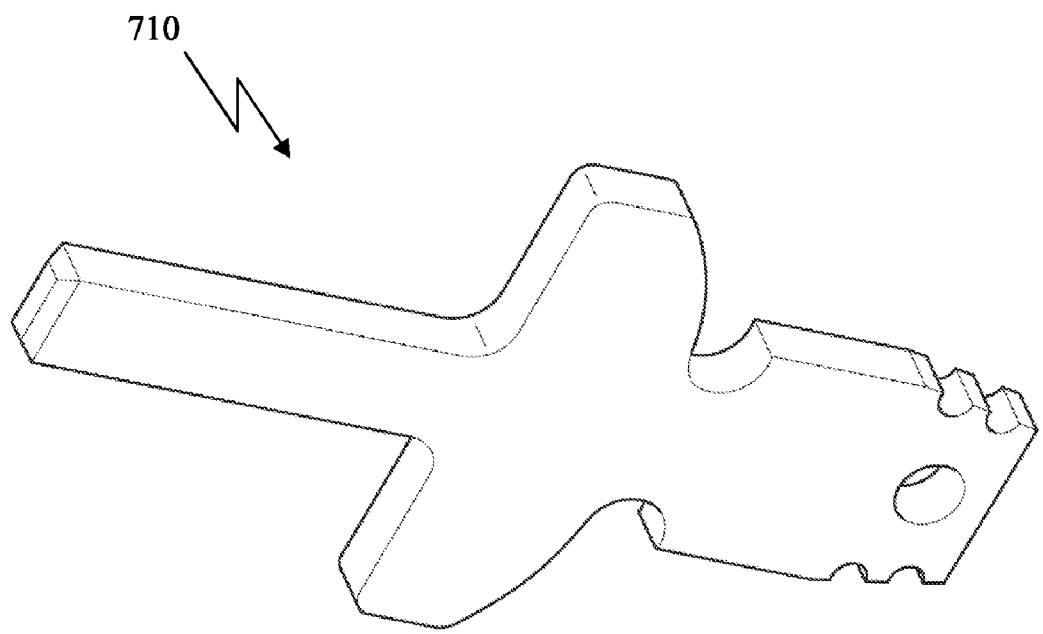
FIG. 12 is a schematic view of the contact pin shown in FIG. 7.
Figure 13:
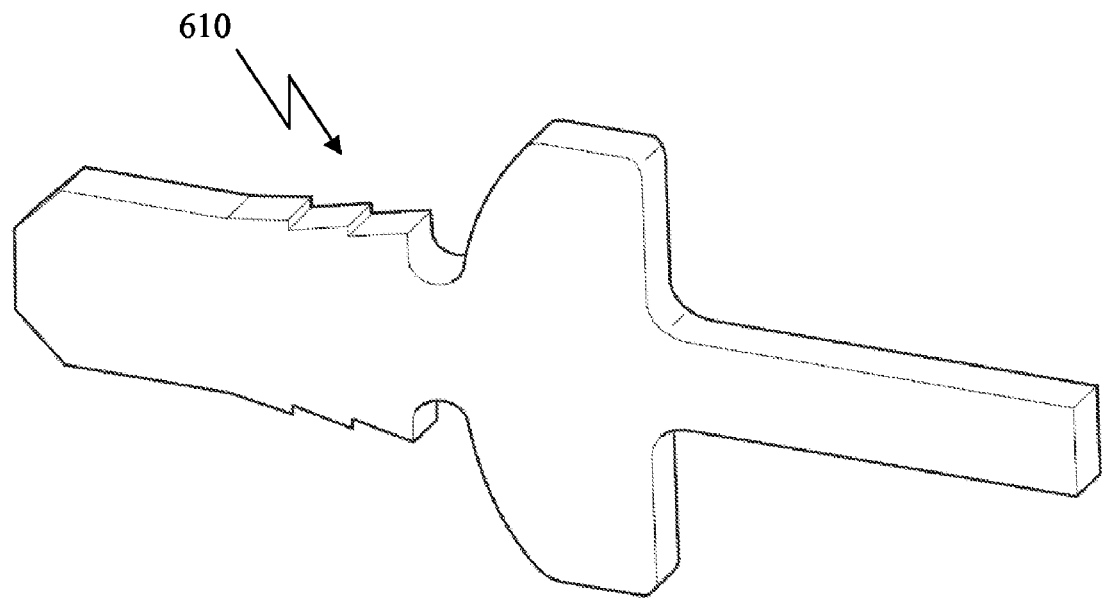
FIG. 13 is a schematic view of the contact pin shown in FIG. 6.
Figure 14:
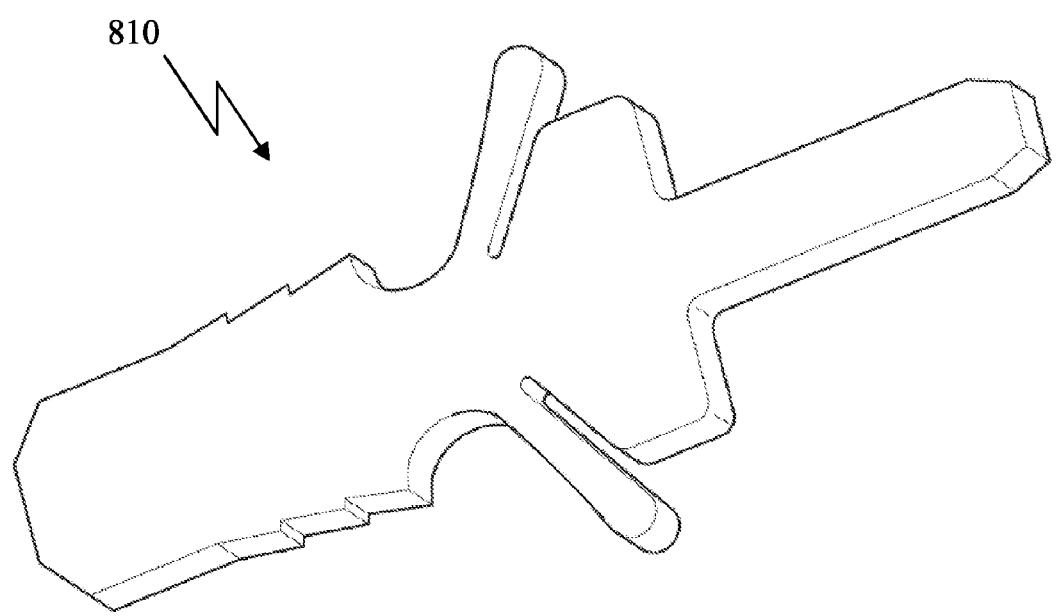
FIG. 14 is a schematic view of the contact pin shown in FIG. 8.
Figure 15:
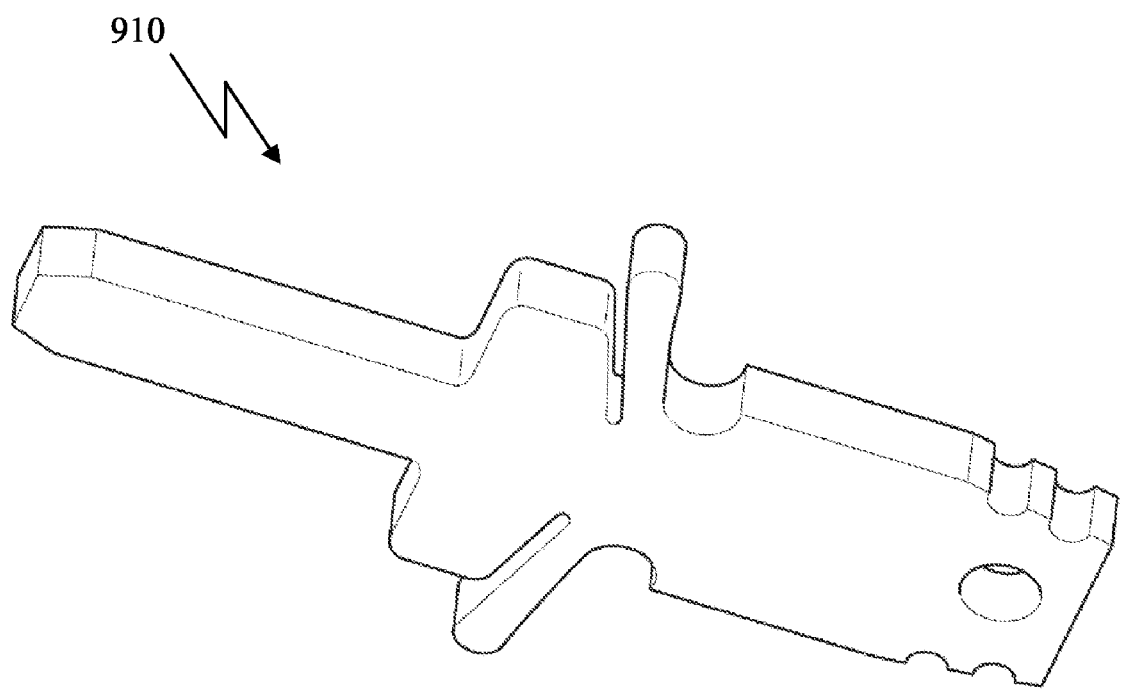
FIG. 15 is a schematic view of the contact pin shown in FIG. 9.

The preferred shape of the contact pins shown in FIGS. 1 to 10 can best be seen from the schematic illustrations given in FIGS. 11 to 15; wherein FIG. 11 is a schematic view of the contact pin shown in FIG. 10; FIG. 12 is a schematic view of the contact pin shown in FIG. 7; FIG. 13 is a schematic view of the contact pin shown in FIG. 6; FIG. 14 is a schematic view of the contact pin shown in FIG. 8 and FIG. 15 is a schematic view of the contact pin shown in FIG. 9. The contact pins can e.g. be cut or punched out from a piece of sheet metal. In practice the pins preferably have a length of several millimeters up to several centimeters. The thickness may be e.g. 0.2 to 0.3 mm. The skilled person will understand that all embodiments of contact pins shown in the FIGS. 1 to 10 may be flat shaped elements as the examples shown in FIGS. 11 to 15.

Alternatively, the contact pins may be rotationally symmetrical around their respective longitudinal axis. This is in particular true for the following contact pins: 120, 140, 220, 230, 321, 610 and 710.

The invention claimed is:

1. An electrical contact pin comprising:
  a top contact termination portion;
  an electrical contact portion connected to the contact termination portion, wherein the electrical contact portion comprises a cantilevered deflectable spring arm; and
  a bottom mechanical fastening portion connected to the contact termination portion,
  wherein the mechanical fastening portion is sized and shaped to be inserted into a hole of a circuit carrier of an electronic device, wherein the deflectable spring arm is sized and shaped to be inserted, at least partially, into a funnel shaped entrance of the hole such that a bottom facing surface of the arm makes direct electrical contact with an electrically conductive member in the funnel shaped entrance.

2. An electrical contact pin as in claim 1 wherein the arm extends upward generally away from the mechanical fastening portion.

3. An electrical contact pin as in claim 2 wherein the contact pin comprises at least two of the cantilevered arms.

4. An apparatus comprising:
  an electronic device comprising a circuit carrier and an electrically conductive member on the circuit carrier, wherein the circuit carrier comprises a hole with a funnel shaped entrance to the hole, and wherein the electrically conductive member extends into the funnel shaped entrance; and
  a contact pin as in claim 1 having the bottom mechanical fastening portion located in the hole, and the deflectable spring arm located at least partially in the funnel shaped entrance and electrically contacting the electrically conductive member in the funnel shaped entrance.

* * * * *